US012642009B2

(12) United States Patent (10) Patent No.: US 12,642,009 B2
Pavlov et al. (45) Date of Patent: May 26, 2026

(54) PACKAGED CURRENT SENSOR INTEGRATED CIRCUIT WITH EXPOSED COOLING PAD

(71) Applicant: Allegro MicroSystems, LLC, Manchester, NH (US)

(72) Inventors: Emil Pavlov, Heidelberg (DE); Ahmad Nour Halawani, Heidelberg (DE); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 131 days.

(21) Appl. No.: 18/606,515

(22) Filed: Mar. 15, 2024

(65) Prior Publication Data

US 2025/0295042 A1 Sep. 18, 2025

(51) Int. Cl.
| | |
|---|---|
| *G01R 19/00* | (2006.01) |
| *G01R 15/20* | (2006.01) |
| *H10N 52/80* | (2023.01) |
| *H10N 59/00* | (2026.01) |

(52) U.S. Cl.
CPC ........... H10N 52/80 (2023.02); G01R 15/202 (2013.01); G01R 19/0092 (2013.01); H10N 59/00 (2023.02)

(58) Field of Classification Search
None
See application file for complete search history.

(56) References Cited

U.S. PATENT DOCUMENTS

| | | | |
|---|---|---|---|
| 5,210,493 A | 5/1993 | Schroeder et al. |
| 5,255,157 A | 10/1993 | Hegel |

| | | | |
|---|---|---|---|
| 5,289,344 A | 2/1994 | Gagnon et al. |
| 5,557,504 A | 9/1996 | Siegel et al. |
| 5,570,273 A | 10/1996 | Siegel et al. |
| 5,963,028 A | 10/1999 | Engel et al. |

(Continued)

FOREIGN PATENT DOCUMENTS

| | | |
|---|---|---|
| EP | 3671228 | 6/2020 |
| EP | 4141451 | 3/2023 |
| FR | 3090121 | 6/2020 |

OTHER PUBLICATIONS

U.S. Appl. No. 18/447,665, filed Aug. 10, 2023, Kasparek.

(Continued)

*Primary Examiner* — Richard Isla

(74) *Attorney, Agent, or Firm* — Daly, Crowley, Mofford & Durkee, LLP

(57) ABSTRACT

A current sensor integrated circuit package includes a primary conductor having an input portion into which a current flows and an output portion from which the current flows, a plurality of secondary leads, and a semiconductor die disposed adjacent to a top surface of the primary conductor and positioned on an insulator portion. In some embodiments, at least one magnetic field sensing element is supported by the semiconductor die. In some embodiments, the package includes a package body with a first portion enclosing the semiconductor die and a first portion of the primary conductor and a second portion enclosing an elongated portion of the plurality of secondary leads, wherein a second portion of the primary conductor is exposed. A pad is secured to the package body and a pillar extends from the primary conductor to the pad.

21 Claims, 8 Drawing Sheets

(56) References Cited

U.S. PATENT DOCUMENTS

| | | | |
|---|---|---|---|
| 6,211,462 | B1 | 4/2001 | Carter, Jr. et al. |
| 6,265,865 | B1 | 7/2001 | Engel et al. |
| 6,326,243 | B1 | 12/2001 | Suzuya et al. |
| 6,356,068 | B1 | 3/2002 | Steiner et al. |
| 6,781,359 | B2 | 8/2004 | Stauth et al. |
| 6,995,315 | B2 | 2/2006 | Sharma et al. |
| 7,005,754 | B2 | 2/2006 | Howarth |
| 7,075,287 | B1 | 7/2006 | Mangtani et al. |
| 7,166,807 | B2 | 1/2007 | Gagnon et al. |
| 7,265,531 | B2 | 9/2007 | Stauth et al. |
| 7,372,147 | B2 | 5/2008 | Dai et al. |
| 7,476,816 | B2 | 1/2009 | Doogue et al. |
| 7,554,180 | B2 | 6/2009 | McKerreghan et al. |
| 7,598,601 | B2 | 10/2009 | Taylor et al. |
| 7,709,754 | B2 | 5/2010 | Doogue et al. |
| 7,816,905 | B2 | 10/2010 | Doogue et al. |
| 8,067,824 | B2 * | 11/2011 | Kwon .................... H10W 44/20 |
| | | | 257/676 |
| 8,080,994 | B2 | 12/2011 | Taylor et al. |
| 8,093,844 | B2 | 1/2012 | Milesi et al. |
| 8,461,677 | B2 | 6/2013 | Ararao et al. |
| 8,486,755 | B2 | 7/2013 | Ararao et al. |
| 8,604,777 | B2 | 12/2013 | Doogue et al. |
| 8,629,539 | B2 | 1/2014 | Milano et al. |
| 8,907,437 | B2 | 12/2014 | Milano et al. |
| 9,190,606 | B2 | 11/2015 | Liu et al. |
| 9,299,915 | B2 | 3/2016 | Milano et al. |
| 9,383,425 | B2 | 7/2016 | Milano et al. |
| 9,494,660 | B2 | 11/2016 | David et al. |
| 9,620,705 | B2 | 4/2017 | Milano et al. |
| 9,666,788 | B2 | 5/2017 | Taylor et al. |
| 9,678,173 | B2 * | 6/2017 | Castro Serrato ....... G01R 33/07 |
| 9,788,403 | B2 | 10/2017 | Mrusek |
| 9,812,588 | B2 | 11/2017 | Vig et al. |
| 9,865,807 | B2 | 1/2018 | Liu et al. |
| 10,049,969 | B1 | 8/2018 | Liu |
| 10,088,533 | B2 | 10/2018 | Rivas et al. |
| 10,120,041 | B2 | 11/2018 | Haas et al. |
| 10,132,879 | B2 | 11/2018 | Latham et al. |
| 10,230,006 | B2 | 3/2019 | Vig et al. |
| 10,234,513 | B2 | 3/2019 | Vig et al. |
| 10,333,055 | B2 | 6/2019 | Milano et al. |
| 10,345,343 | B2 | 7/2019 | Milano et al. |
| 10,352,969 | B2 | 7/2019 | Milano et al. |
| 10,509,058 | B2 | 12/2019 | Cadugan et al. |
| 10,578,684 | B2 | 3/2020 | Cadugan et al. |
| 10,607,925 | B2 | 3/2020 | David et al. |
| 10,718,794 | B2 | 7/2020 | El Bacha et al. |
| 10,725,100 | B2 | 7/2020 | Milano et al. |
| 10,753,963 | B2 | 8/2020 | Milano et al. |
| 10,916,665 | B2 | 2/2021 | Vig et al. |
| 11,024,576 | B1 | 6/2021 | West et al. |
| 11,085,952 | B2 | 8/2021 | Cadugan et al. |
| 11,289,406 | B2 | 3/2022 | Briano et al. |
| 11,444,209 | B2 | 9/2022 | Vig et al. |
| 11,519,946 | B1 | 12/2022 | Rock et al. |
| 11,768,229 | B2 | 9/2023 | Boden et al. |
| 11,768,230 | B1 | 9/2023 | Liu et al. |
| 11,810,832 | B2 * | 11/2023 | Patel ................... H01L 25/0655 |
| 2002/0190703 | A1 | 12/2002 | Goto et al. |
| 2003/0193018 | A1 | 10/2003 | Tao et al. |
| 2004/0124505 | A1 | 7/2004 | Mahle et al. |
| 2005/0030018 | A1 | 2/2005 | Shibahara et al. |
| 2005/0124185 | A1 | 6/2005 | Cromwell et al. |
| 2007/0126092 | A1 | 6/2007 | San Antonio et al. |
| 2007/0279053 | A1 | 12/2007 | Taylor et al. |
| 2010/0156394 | A1 | 6/2010 | Ausserlechner et al. |
| 2011/0049685 | A1 | 3/2011 | Park et al. |
| 2011/0234215 | A1 | 9/2011 | Ausserlechner |
| 2011/0248711 | A1 | 10/2011 | Ausserlechner |
| 2012/0089266 | A1 | 4/2012 | Tomimbang et al. |
| 2013/0138372 | A1 | 5/2013 | Ausserlechner |
| 2014/0253103 | A1 | 9/2014 | Racz et al. |
| 2015/0108967 | A1 | 4/2015 | Barczyk |
| 2015/0270198 | A1 | 9/2015 | Cuoco et al. |
| 2016/0187388 | A1 | 6/2016 | Suzuki et al. |
| 2016/0216296 | A1 | 7/2016 | Nakayama et al. |
| 2016/0223594 | A1 | 8/2016 | Suzuki et al. |
| 2016/0313375 | A1 | 10/2016 | Etschmaier |
| 2017/0179067 | A1 | 6/2017 | Aoki et al. |
| 2018/0166350 | A1 | 6/2018 | Racz et al. |
| 2018/0306843 | A1 | 10/2018 | Bussing et al. |
| 2019/0049527 | A1 | 2/2019 | Vig et al. |
| 2019/0154737 | A1 | 5/2019 | Nobira |
| 2019/0204363 | A1 | 7/2019 | Suzuki et al. |
| 2019/0369144 | A1 | 12/2019 | Mauder et al. |
| 2020/0033384 | A1 | 1/2020 | Kishi et al. |
| 2020/0064382 | A1 | 2/2020 | Takata et al. |
| 2020/0191835 | A1 | 6/2020 | Bilbao de Mendizabal et al. |
| 2021/0243911 | A1 | 8/2021 | Tang et al. |
| 2021/0263077 | A1 | 8/2021 | Hirano et al. |
| 2021/0397015 | A1 | 12/2021 | Moon |
| 2022/0018880 | A1 | 1/2022 | Houis |
| 2023/0060219 | A1 | 3/2023 | Liu et al. |
| 2023/0221355 | A1 | 7/2023 | Liu |
| 2024/0044946 | A1 | 2/2024 | Briano et al. |
| 2024/0047314 | A1 | 2/2024 | Briano et al. |
| 2025/0275485 | A1 * | 8/2025 | Lo ......................... H10N 52/80 |

OTHER PUBLICATIONS

U.S. Appl. No. 18/450,494, filed Aug. 16, 2023, Hein et al.
U.S. Appl. No. 18/512,122, filed Nov. 17, 2023, McNally et al.
Preliminary Amendment filed on Jan. 12, 2022 for U.S. Appl. No. 17/409,011; 6 pages.
European Examination Report dated Aug. 28, 2023 for European Application No. 22183450.0; 4 pages.
European Extended Search Reporting dated Dec. 22, 2022 for European Application No. 22183450.0; 7 pages.
European Response filed on Jun. 14, 2023 for European Application No. 22183450.0; 24 pages.
Notice of Allowance dated Aug. 23, 2022 for U.S. Appl. No. 17/409,011; 13 pages.
Notice of Allowance dated Aug. 9, 2023 for U.S. Appl. No. 17/654,254; 5 pages.
Office Action dated Mar. 15, 2023 for U.S. Appl. No. 17/654,254; 19 pages.
Response to Office Action dated Mar. 15, 2023 filed on Mar. 22, 2023 for U.S. Appl. No. 17/654,254; 10 pages.
Office Action dated May 19, 2023 for U.S. Appl. No. 17/654,254; 15 pages.
Response to European Examination Report dated Aug. 28, 2023 for European Application No. 22183450.0 as filed on Oct. 30, 2023; 18 pages.
Response to Office Action dated May 19, 2023, filed on May 25, 2023 for U.S. Appl. No. 17/654,254; 9 pages.
Search Reporting and Written Opinion dated Apr. 25, 2023, for PCT Application No. PCT/US2022/051968; 16 pages.
Steve Bush, "DNP claims world's thinnest chip package"; https://www.electronicsweekly.com/news/products/micros/dnp-claims-worlds-thinnest-chip-package-2009-03/; Mar. 2009; 4 pages.

* cited by examiner

PACKAGED CURRENT SENSOR INTEGRATED CIRCUIT WITH EXPOSED COOLING PAD

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

SUMMARY

According to one aspect of the present disclosure, a current sensor integrated circuit package. In some embodiments, the package includes a primary conductor having an input portion into which a current flows and an output portion from which the current flows, a plurality of secondary leads, and a semiconductor die disposed adjacent to a top surface of the primary conductor and positioned on an insulator portion. In some embodiments, at least one magnetic field sensing element is supported by the semiconductor die. In some embodiments, the package includes a package body comprising a first portion enclosing the semiconductor die and a first portion of the primary conductor and a second portion enclosing an elongated portion of the plurality of secondary leads, wherein a second portion of the primary conductor is exposed. In some embodiments, a pad is secured to the package body and a pillar extends from the primary conductor to the pad.

According to one aspect of the present disclosure, a portion of the pad extends beyond a periphery of the package body. In some embodiments, the second, exposed portion of the primary conductor comprises the input portion of the primary conductor and the output portion of the primary conductor. In some embodiments, the portion of the pad extends over either the input portion of the primary conductor or the output portion of the primary conductor. In some embodiments, the pillar is disposed between the portion of the pad that extends beyond the periphery of the package body and the second, exposed portion of the primary conductor.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1:
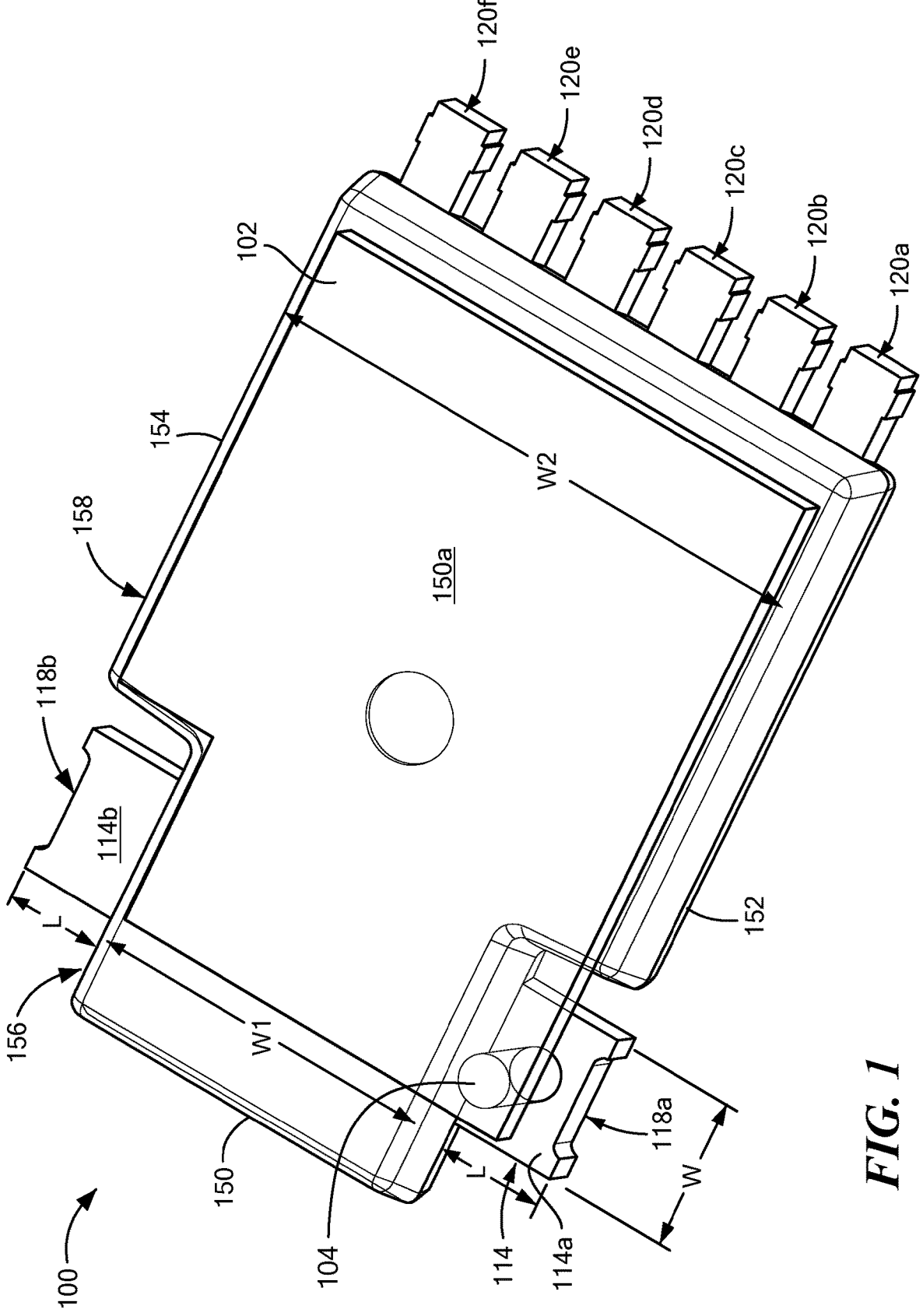
FIG. 1 is a perspective top view of a packaged current sensor integrated circuit according to the disclosure.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall effect element, a vertical Hall effect element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ).

The magnetic field sensing element may be a single element or, alternatively, may include two or more magnetic field sensing elements arranged in various configurations, e.g., a half-bridge or full (Wheatstone) bridge, configured for single-ended or differential sensing. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). A coil may also be used to sense magnetic fields, which may be referred to as inductive sensing. Using a coil to sense a magnetic field is more typical as the frequency of the magnetic field to be sensed increases.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall effect elements tend to have axes of sensitivity perpendicular to a substrate, while metal based or metallic magnetoresistance elements (e.g., GMR, TMR, AMR) and vertical Hall effect elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 2:
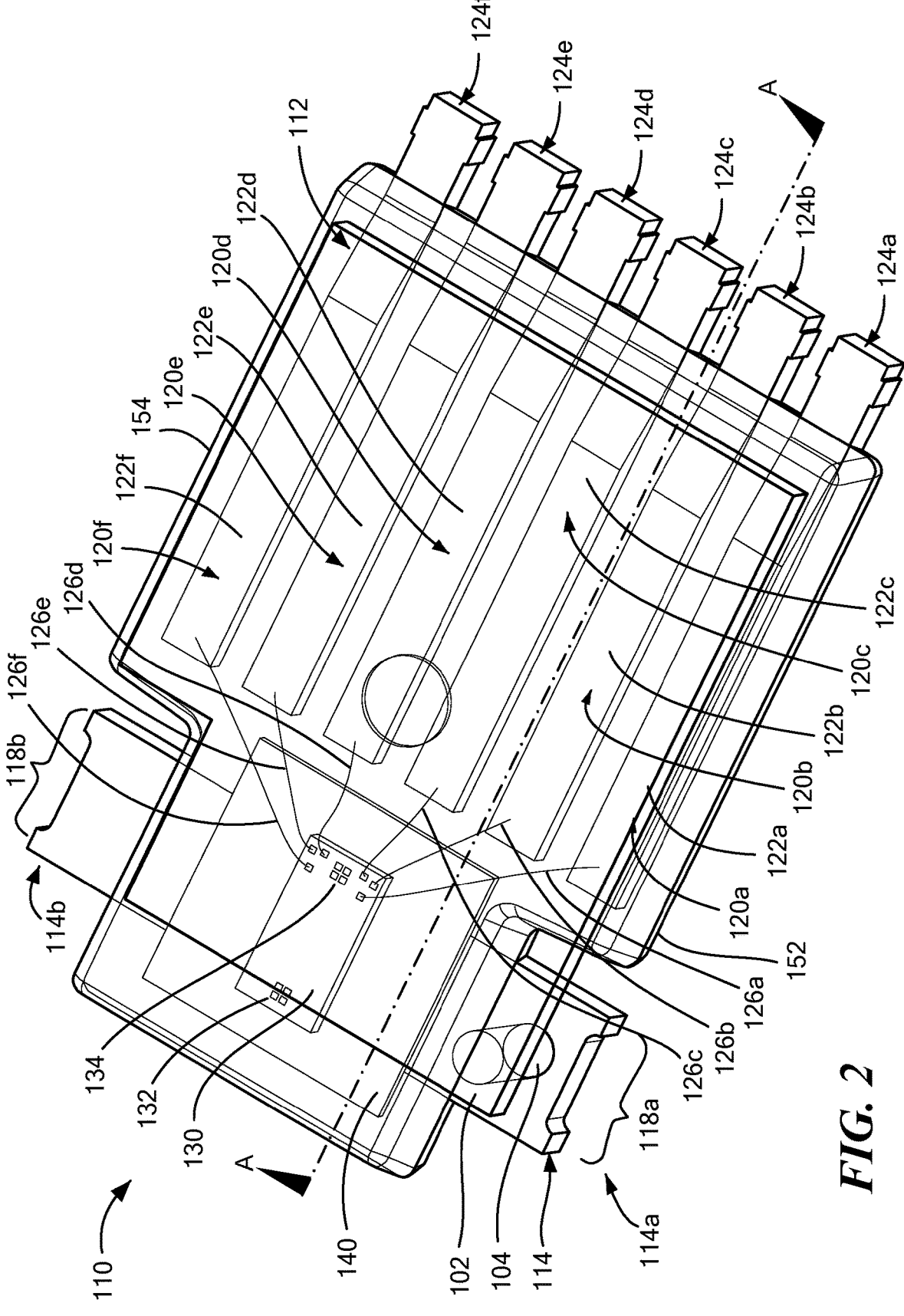
FIG. 2 shows the packaged current sensor integrated circuit of FIG. 1 with the package body in phantom.
Figure 3:
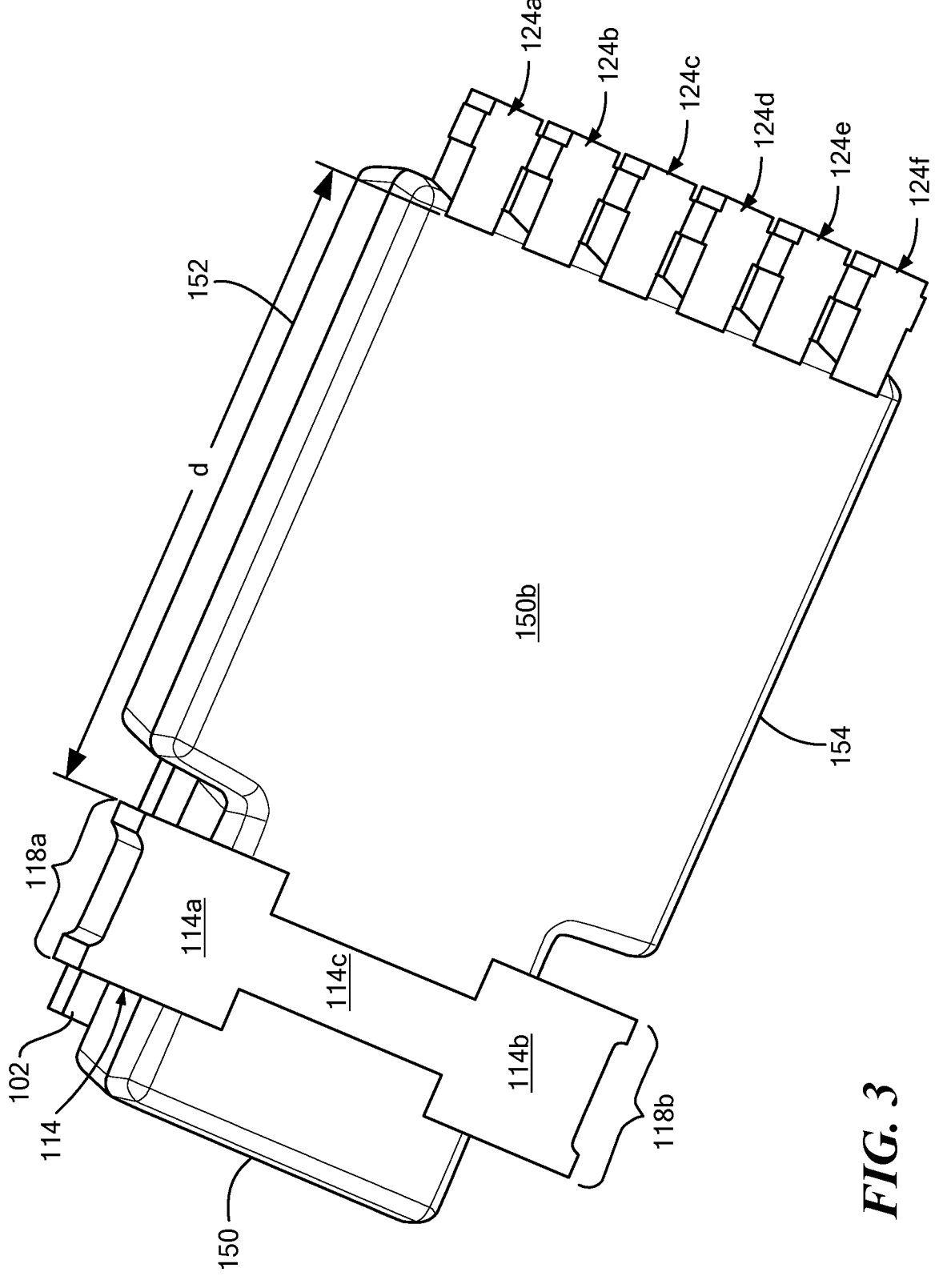
FIG. 3 is a bottom view of the packaged current sensor integrated circuit of FIG. 1.
Figure 4:
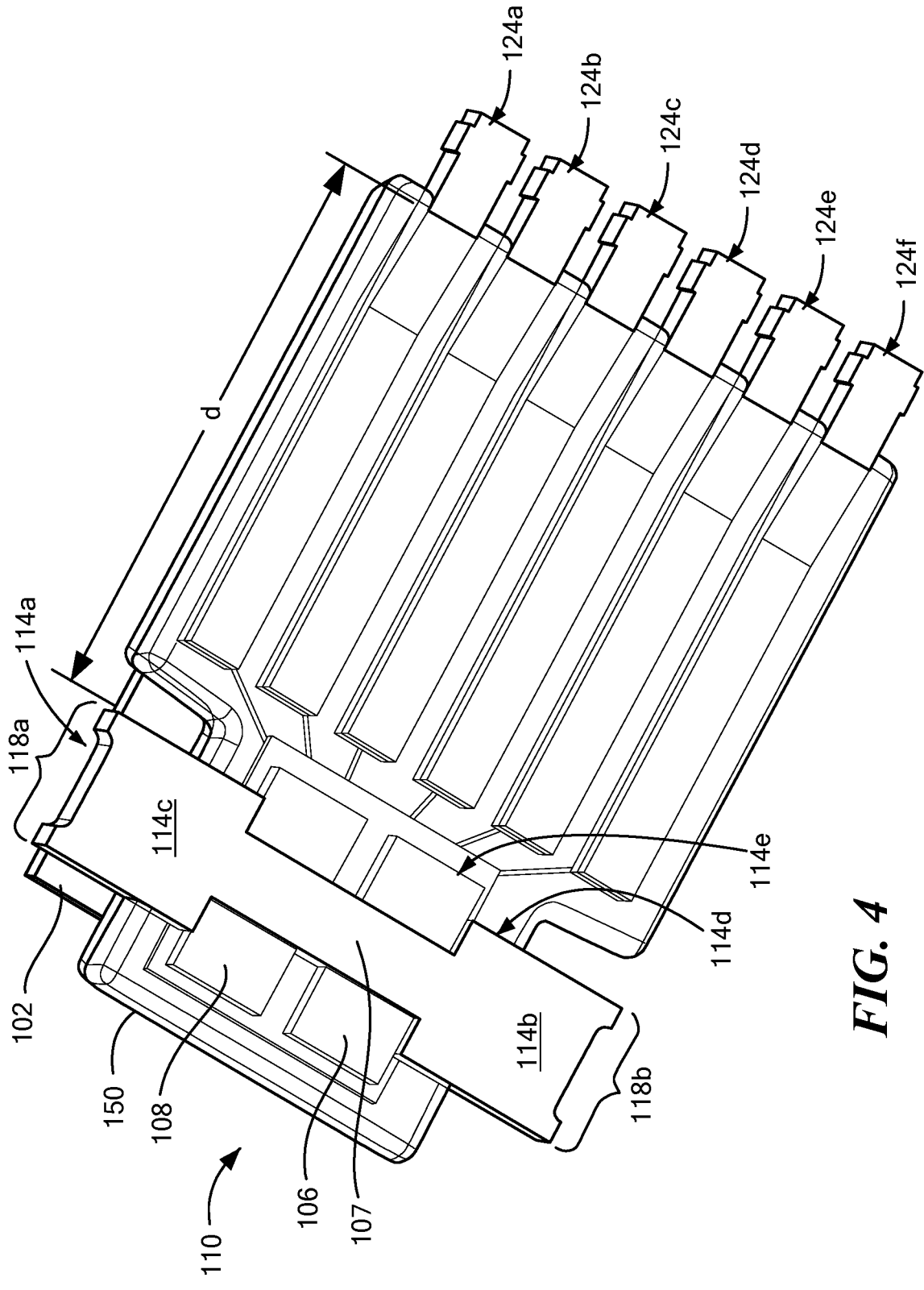
FIG. 4 is a bottom view of the packaged current sensor integrated circuit of FIG. 1 with the package body in phantom.

Referring to the various views of FIGS. 1-5, a packaged current sensor integrated circuit (IC) 100 includes a primary conductor 114 having an input portion 114a into which a current flows, an output portion 114b from which the current flows, and an exposed portion 114c (shown in the bottom views of FIGS. 3 and 4). A semiconductor die 130 is disposed adjacent to the primary conductor 114 and is positioned on an insulator portion 140. At least one magnetic field sensing element 132, 134 is supported by the semiconductor die 130. A package body 150 encloses the semiconductor die 130 and a portion of the primary conductor 114 and has an upper package body surface 150a, a lower package body surface 150b, and side package edges 152, 154.

A pad 102 is secured to the package body 150. The pad 102 may be secured to the upper package body surface 150a through a non-conductive adhesive 103 disposed between the pad 102 and the upper package body surface 150a.

A pillar 104 extends from the primary conductor 114 to the pad 102. The pillar 104 can be attached to the primary conductor 114 through soldering or welding.

The pad 102 and pillar 104 cool the packaged current sensor IC 100. The pillar 104 provides a low heat resistance path for dissipated heat to flow to the pad 102, rather than to the semiconductor die 130. The heat is then dispersed out of the packaged current sensor IC 100 by the pad 102.

The pillar 104 and pad 102 can be comprised of various materials selected for heat conductivity and other factors. In an example embodiment, the pillar 104 and pad 102 are comprised of copper. It will be appreciated by those of ordinary skill in the art that the pillar 104 and the pad 102 may or may not be comprised of the same material.

Additionally, the pad 102 can provide high frequency stray-field shielding. Conductive material creates an eddy current that acts as a shield, accordingly the material the pad 102 is made of may provide stray field shielding. The pad 102 provides interference immunity against external varying magnetic fields via the eddy current induced in the material the pad 102 is made of. The amount of interference immunity may be determined based on: the properties of the material the pad 102 is made of; the dimensions of the pad 102; and the frequency and strength of the external magnetic field. The pad 102 may comprise a ferrous material or nonferrous material, which shield against magnetic fields that may be generated. Nonferrous material, such as aluminum or copper, can provide a higher interference immunity. Example ferrous materials include materials such as iron or nickel.

Figures 5, 6:
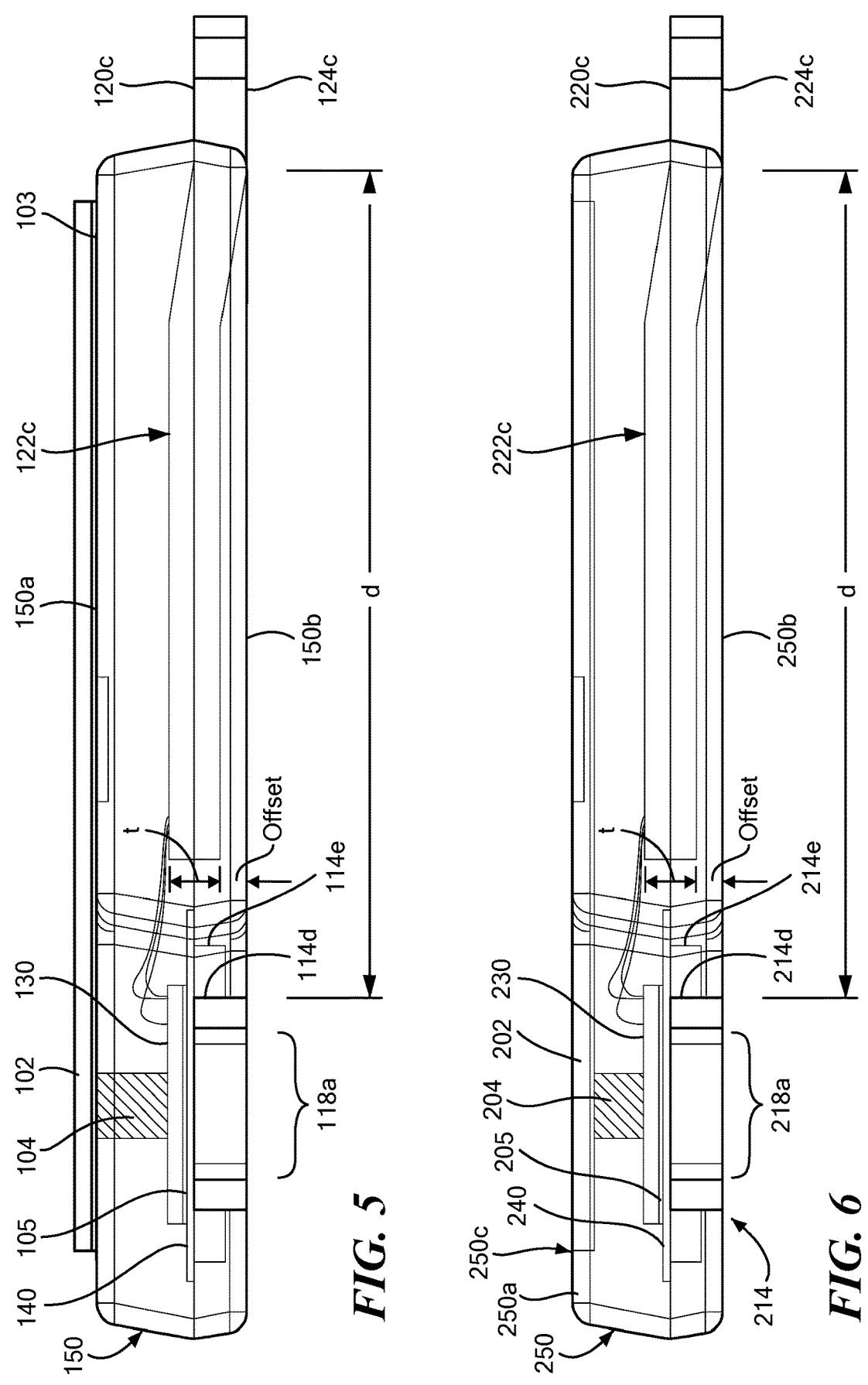
FIG. 5 is a cross-sectional side view of the packaged current sensor integrated circuit of FIG. 1 taken along the line A-A of FIG. 2.
FIG. 6 is a cross-sectional side view of another embodiment of a packaged current sensor integrated circuit, with a pad partially embedded in the package body.

A secondary lead, such as lead 120a, has an exposed portion 124a that is spaced from the exposed portion 114c of the primary conductor 114 by an isolation distance "d" (shown in the views of FIGS. 3, 4, and 5). A lead frame 112 (labeled in FIG. 2) includes the primary conductor 114 and one or more secondary leads (here a plurality of secondary leads 120a-120f).

The example current sensor IC 100 has secondary leads 120a, 120b, 120c, 120d, 120e, 120f. In other embodiments, in which fewer than the illustrated six leads are required or more than the illustrated six leads are required for providing more power, ground, output signals, a fault signal, or other input and output pins, there may be fewer or more than six secondary leads. Wire bonds 126a, 126b, 126c, 126d, 126e, 126f connect the die 130 to the secondary, or signal leads, 120a, 120b, 120c, 120d, 120e, 120f, respectively, as shown in the view of FIG. 2. In an embodiment, one or more secondary leads 120a, 120b, 120c, 120d, 120e, 220f can be connected to die 130 using two or more wire bonds. This may be advantageous when a potential for higher current exists in the operation of the integrated circuit, such as for a power or ground connection to die 130.

Secondary leads 120a-120f can be elongated from a first end adjacent to the primary conductor 114 to the exposed portion 124a-124f, respectively, and thus, can be described as having an elongated portion 122a, 122b, 122c, 122d, 122e, 122f. Secondary leads 120a-120f can have a substantially constant thickness "t" (labeled in FIG. 5).

Creepage refers to the shortest distance between primary and secondary conductors along a surface of any insulation material common to both parts, such as the lower surface 150b of the package body 150 outside of the package. The isolation distance "d" between the exposed portion 114c of the primary conductor 114 and the exposed portion 124a-124f of any secondary lead 120a-120f, respectively, provides the creepage distance and can be at least 2.0 mm.

The package body 150 has a first portion 156 enclosing the semiconductor die 130 and a portion of the primary conductor 114 and a second portion 158 enclosing elongated portion 122a-122f of the plurality of secondary leads 120a-120f. The first portion 156 of the package body 150 has a first width "W1" configured to expose the input portion 114a of the primary conductor and the output portion 114b of the primary conductor and the second portion 158 of the package body 150 has a second width "W2" between a first side edge 152 of the package body and a second side edge 154 of the package body that is larger than the first width. The pad 102 may be secured to the first portion 156 of the package body 150, the second portion 158 of the package body 150, or to both the first portion 156 and the second portion 158 of the package body 150.

The exposed input portion 114a of the primary conductor 114 and the exposed output portion 114b of the primary conductor 114 each can have a length "L" of at least 0.5 mm. In some embodiments, the exposed length can be between 0.5 mm-1.5 mm. The exposed input portion 114a of the primary conductor and the exposed output portion 114b of the primary conductor are configured to accept one or both of a clamp or a test probe.

Lead frame 112 can be stamped from a copper sheet and can be relatively thick (e.g., at least 15 mils thick) in order to support high current (e.g., 200 amps) applications. In lower current applications, more standard lead frame thicknesses, such as on the order of 8 mils or 10 mils can be used. Alternatively, lead frame 112 can include interconnected metal layers as may be part of a so-called molded interconnect substrate (MIS) that includes a pre-molded structure with one or more layers, with each layer configured with plating or interconnects to provide electrical connections in the package.

The primary current conductor 114 can include die attach portions 106, 108 and a current path portion 107 between the die attach portions. The primary conductor 114 supports insulator, or insulator portion 140, and semiconductor die 130. Die attach portions 106, 108 can alternatively be referred to as die attach pads or paddles. Die 130 supports at least one magnetic field sensing element, and, in an example embodiment, supports at least two magnetic field sensing elements 132, 134. The die 130 can also support circuitry to amplify and otherwise process signals from the magnetic field sensing elements 132, 134 and provide an output of the current sensor integrated circuit 100. As current flows through the primary conductor 114, a magnetic field is generated and sensed by magnetic field sensing elements 132, 134. In some embodiments, each element 132, 134 is comprised of a plurality of elements, such as four, as may be coupled in a bridge configuration.

In embodiments, the input portion 114a of the primary conductor 114 is exposed from the first side edge 152 of the package body 150 and the output portion 114b of the primary conductor 114 is exposed from the second side edge 154 of the package body that is substantially parallel with respect to the first side edge of the package body.

A portion of the pad 102 can extend beyond a periphery of the package body 150. For example, the pad 102 can extend beyond a periphery of the first portion 156 of the package body 150 towards the input portion 114a, the output portion 114b, or both the input portion 114a and the output portion 114b of the primary conductor 114. In FIGS. 1-5, the pad 102 extends beyond the first portion 156 of the package body towards the input portion 114a of the primary conductor.

The pillar 104 is disposed between the portion of the pad 102 that extends beyond the periphery of the package body 150 and the primary conductor 114. The pillar 104 is disposed between the pad 102 and either the input portion 114a or the output portion 114b of the primary conductor 114. In FIGS. 1-5, the pillar 104 is disposed between the pad 102 and the input portion 114a of the primary conductor 114. The pillar 104 is positioned on one side of the primary conductor 114, accordingly it will not disrupt the current measurement of the packaged current sensor IC 100 by diverting current from the conductor 114.

The input portion 114a of the primary conductor 114 has a reduced area edge 118a and the output portion 114b has a reduced area edge 118b. By reduced area edge it is meant that the edge surface has a reduced surface area as compared to a flat edge. Each example reduced area edge 118a, 118b has a notch between edge ends, as shown. The reduced area edges 118a, 118b provide tie bars which, during fabrication, are connected to like edges of primary conductors of adjacently fabricated packages. In other words, multiple current sensor integrated circuits are fabricated from a single lead frame (couped together by tie bars in the form of the reduced area edges 118a, 118b) and are singulated along the side edges 152, 154 of the package body 150 through the reduced area edges 118a, 118b.

Providing primary conductor edges 118a, 118b along which the package is singulated (i.e., the connecting tie bar area) with a reduced area (i.e., as opposed a solid edge of a width "w" that needs to be cut) reduces the force required by the singulation process. For example, in the case of punching to singulate, the force required to punch through the reduced edge area is less and therefore, the IC package experiences lower stress and wear on the punch tool is reduced.

Reduced edge areas 118a, 118b are spaced by less than or equal to the width W2 between the first side edge 152 of the package body and a second side edge 154 of the package body so that edge area 118a does not extend beyond side edge 152 and edge area 118b does not extend beyond side edge 154. This arrangement advantageously prevents the IC packages from jamming in the tube during testing.

The elongated portion 122a, 122b, 122c, 122d, 122e, 122f of the secondary leads 120a, 120b, 120c, 120d, 120e, 120f, and 120g, respectively, is offset with respect to the exposed portion 124a, 124b, 124c, 124d, 124e, 124f of the respective secondary lead in a direction of the package height or, in other words, the secondary leads 120a-120f are offset with respect to the exposed portions 124a-124f in the direction of a thickness "t" as shown (see FIG. 5). A typical lead thickness "t" can be on the order of 0.5 mm. In embodiments, the dimension of the offset of the secondary leads 120a-120f can be on the order of 0.25 mm. However, it will be appreciated by those of ordinary skill in the art that a smaller offset dimension, such as on the order of 0.1 mm, or a larger offset dimension are possible. With this arrangement, achieving a desired creepage distance can be facilitated by providing the secondary leads 120a-120f with an offset elongated portion 122a-122f that is thereby encapsulated by the package body 150. In other words, by offsetting the secondary leads 120a-120f in this manner, the bottom surface of the elongated portion 122a-122f is encased by the mold material of the package body 150, resulting in the creepage distance "d" extending between the exposed portion 114c of the primary conductor 114 and the exposed portions 124a-124f of the secondary leads 120a-120f. Notably, this offset arrangement of secondary leads can achieve the same creepage as using secondary leads that have a thinned elongated portion formed by of a half etch process but can alleviate manufacturing challenges associated with half etch processing of long leads since such relatively long half etched secondary leads can be prone to bending.

The illustrated secondary leads 120a-120f can have a substantially constant thickness "t" (labeled in FIG. 5) or can have a thinned elongated portion formed by of a half etch process. In embodiments, the isolation, or creepage distance "d" is at least 7.2 mm and can be at least 8.0 mm. With a creepage distance of at least 7.2 mm, reinforced isolation according to a standard, such as IEC60664, is achieved for basic working voltages>1000 VRMS. In some embodiments, lower voltage isolation requirements may exist and the isolation distance "d" may be at least 1.0 mm, 2.0 mm, or 4.0 mm to meet certain isolation requirements in different applications.

Clearance refers to the shortest distance between conductors of differing voltage levels, such as between primary and secondary conductors, through an insulating material, such as air outside of the package or through an insulating material inside or outside the package.

Increased clearance distance can be facilitated by the insulator portion 140 extending beyond an edge, such as a top edge 114e of the primary conductor 114 as shown in FIG. 5, since such extended insulator portion increases the clearance distance between the lower voltage level semiconductor die 130 and the higher voltage primary conductor 114. The insulator portion 140 extends beyond edge 114e of the primary conductor 114 in order to provide voltage isolation. In general (although the illustrated insulator portion 140 extends beyond the primary conductor edge 114e in an example embodiment), the insulator portion 140 need only extend beyond the die 130 by at least 200 microns and preferably by 400 microns. In an embodiment, the insulator portion 140 may extend beyond the edge 114e of the primary conductor 114 by at least 50 microns, and in another embodiment the insulator portion 140 extends beyond the edge 114e of the primary conductor 114 by at least 375 microns. An embodiment may have the insulator portion 140 not extend beyond the edge 114e of the primary conductor 114 where the other dimensions provide sufficient electrical isolation for the desired application.

From the bottom views of FIGS. 3 and 4, it can be seen that each of the secondary leads 120a, 120b, 120c, 120d, 120e, 120f has an exposed portion 124a, 124b, 124c, 124d, 124e, 124f, respectively, on the bottom of the package. Further, lower surface 114c of the primary conductor 114 is also exposed on the bottom of package 100. In use, exposed surface 114c of the primary conductor 114 may be connected to a circuit board or other substrate.

Current path portion 107 of the primary conductor 114 between the input and output portions 114a, 114b can be narrowed, as shown, to concentrate the magnetic field in the vicinity of the sensing elements 132, 134. Die attach portions 106, 108 are configured to enhance mechanical securing of the mold material 150 to the lead frame.

The magnetic field sensing elements 132, 134 are positioned off of or to the side of the current conductor portion 107 so that the magnetic field generated by the current flowing in the current conductor portion 107 has a directional component that is perpendicular, or in an embodiment near perpendicular (e.g., in some embodiments within +/−20 degrees of perpendicular and in other embodiments more than +/−20 degrees), to the die 130 such that planar Hall effect elements may be used for magnetic field sensing elements 132, 134. If the magnetic field sensing elements 132, 134 are Hall effect elements, one Hall effect element may be designed to have a positive voltage output when the magnetic field sensed is out of the die 130 (where for clarity "out" is the direction away from the current conductor portion 107), and the second Hall effect element may have a negative voltage when the magnetic field sensed is out of the die 130. Various processing circuitry is responsive to signals from the magnetic field sensing elements for generating an output signal indicative of the current through the current conductor portion 107. Such processing circuitry can include, but is not limited to an amplifier, and in some embodiments a differential amplifier, supported by the integrated circuit die 130 and configured to generate a signal indicative of the difference between the two Hall effect element output voltages. Using the difference between the two magnetic field sensing element output voltages when they are Hall effect elements allows for the integrated circuit to reduce or eliminate the effects of external magnetic fields that are not a result of current through the primary current path, including the current conductor portion 107 (i.e., stray magnetic fields). In other embodiments, the magnetic field sensing elements, or a magnetic field element may be positioned on die 130 over the primary current conductor portion 107 to sense a magnetic field with a component parallel to the surface of die 130. In a case where the magnetic field component to be sensed is parallel to the surface of the die 130, a vertical Hall effect element or a magnetoresistance element such as a GMR, TMR, or AMR element may be used.

Accordingly, the magnetic field sensing elements 132, 134 are positioned off of or to the side of the current conductor portion 107 so that the magnetic field generated by the current flowing in the current conductor portion 107 has a directional component that is perpendicular, or near perpendicular, to the die 130 such that planar Hall effect elements may be used. Various processing circuitry is responsive to signals from the magnetic field sensing elements for generating an output signal indicative of the current through the current conductor portion 107. In other embodiments, the magnetic field sensing elements may be positioned over the primary current conductor portion 107 to sense a magnetic field with a component parallel to the surface of die 130, in which case a vertical Hall effect element or a magnetoresistance element such as a GMR, TMR, or AMR element may be used.

Die 130 is supported by one or both of the die attach portions 106, 108 and is positioned over the insulator portion 140. Die 130 may be attached to the insulator portion 140 by a non-conductive coating (not shown), such as a wafer backside coating (WBC) or a non-conductive epoxy or a dispensed die attach material, die attach film, or other material. The insulator portion 140 is attached to die attach portions 106, 108. Alternatively, die 130 can be attached to the insulator portion 140 by a conductive material as may reduce the effects of partial discharge from voids in the die attach material. Die 130 may be attached to die attach portions 106, 108 by insulator portion 140 where the insulator is a dielectric tape, for example a Kapton® or other insulating tape with a layer of adhesive on one side of the tape or on each side of the dielectric tape layer. In another embodiment, an epoxy die attach material, a die-attach film (DAF), or an insulating coating material may be applied as the insulator portion 140 in place of the tape. Further, thin fiberglass, glass, ceramic or other thin insulating layers can be used instead of tape. Aspects of insulator portion 140 can be the same as or similar to insulation structures described in U.S. Pat. No. 10,753,963, issued on Aug. 25, 2020, entitled "Current Sensor Isolation" and hereby incorporated herein by reference in its entirety. In manufacturing, if two layers of wafer backside coating are used, a first wafer backside coating layer 105 may be fully cured (or partially cured if only one layer of a wafer backside coating is used) before a second layer of wafer backside coating is partially cured (also known as B stage cured) to attach die 130 to insulator portion 140.

In another embodiment, die 130 may be attached to the insulator portion 140 by other materials, including but not limited to a non-conductive die attach epoxy, or a tape. Multiple layers of wafer backside coating, tape, DAF and non-conductive epoxy may be used for electrical isolation. A combination of wafer backside coating, tape, DAF, or non-conductive epoxy may be used to achieve electrical isolation and attachment to the die attach portion 106, 108.

The insulator portion 140 can provide a second layer of isolation between the primary conductor 114 and wire bonds 126a-126f and secondary leads 120a-120f, which allows a thinner package than if a 0.4 mm distance were required. It will be appreciated that the isolation distances can be readily varied by stretching or shortening the length of the enclosed portion of the secondary leads in order to achieve a desired isolation voltage.

The insulator portion 140 can extend beyond one or more edges, such as a top edge 114e and/or a side edge 114d of the primary conductor 114 in the direction of, or from the side of the primary conductor towards, the secondary leads 120a-120f. For example, in embodiments, the insulator portion 140 may extend beyond the top edge 814e of the primary conductor 114 in the direction of the secondary leads 120a-120f by at least 0.1 mm, 0.2 mm, or 0.4 mm depending on the voltage isolation requirements.

According to an example manufacture process, lead frame 112 is formed with primary current conductor 114 and secondary signal leads 120a-120f, following which insulation portion 140 is applied to the primary conductor. The lead frame 112 may be stamped from a single sheet of copper. The pillar 104 is disposed on the lead frame 112 in a subsequent fabrication step. The insulation 140 may comprise one or more of a dielectric tape, an insulating epoxy material, or a piece of insulating material including but not limited to alumina or glass substrate material. The integrated circuit die 130 is then attached to the subassembly. Attachment of the die 130 can include, but is not limited to, use of a wafer backside coating material, a tape attachment material, and/or an insulating epoxy material, which may also be referred to as a non-conductive epoxy material.

The integrated circuit die 130 is electrically connected to the signal leads 120a-120f, such as with wire bonds 126a-126f, respectively. Other electrical connections, including flip-chip assembly methods, may be used provided they meet the isolation requirements of the application. Thereafter, a mold material is applied to the subassembly including the lead frame 112, integrated circuit die 130, and wire bonds 126a-126f in order to form package body 150.

After the mold process that forms the package body 150, the pad 102 is secured to the package body 150. In order to secure the pad 102, adhesive 103 is disposed on the package body 150, the pad 102 is disposed on the adhesive 103. Alternatively, or in addition to the adhesive 103, the pad 102 may be disposed in the package body 150 so as to secure the pad 102 to a part of the package body 150. Accordingly, a portion of the pad 102 may be disposed in the package body 150 such that a portion of the package body 150 may surround or encompass the pad 102. The pad 102 is disposed such that it contacts the pillar 104. Following, the packages are cut, or singulated, with a process such punching, to form individual integrated circuit packages. Singulation results in the above-described configuration in which the primary conductor does not extend beyond the molds. As described above, advantageously, the reduced area edges 118a, 118b reduce the force required for punch singulation and thereby reduce the stress on the resulting IC packages and wear on the punch tool.

Other steps may follow manufacturing which include, but are not limited to a final test procedure, or programming the integrated circuit package. In the case of a current sensor integrated circuit package, there may be a test step and maybe programming of the integrated circuit die at the integrated circuit package level, and then a second test and programming may be performed, for example, when the current sensor integrated circuit package is applied to a printed circuit board or other assembly where the current sensor integrated circuit package is used. This second programming after assembly of the current sensor integrated circuit package onto a PC board or other assembly, allows a more accurate measurement of the current to be made as other influences such as PC board currents can be accounted for in the current sensor integrated circuit. As noted above, provision of cutouts 156, 158 in the side edges 152, 154 of package body 150 such that the reduced area edges 118a, 118b of the primary conductor 114 do not extend beyond the package body edges 152, 154 facilitates testing by reducing jamming of the package in the tube used for testing.

Manufacturing steps, including test steps, can be facilitated by the package body design with the first portion 156 having a width W1 configured to expose the input portion 114a of the primary conductor and the output portion 114b of the primary conductor. As noted above, the exposed input portion 114a of the primary conductor 114 and the exposed output portion 114b of the primary conductor 114 each can have a length of at least 0.5 mm. In some embodiments, the exposed length can be between 0.5 mm-1.5 mm. The exposed input portion 114a of the primary conductor and the exposed output portion 114b of the primary conductor are configured to accept one or both of a clamp or a test probe.

Referring to FIG. 6, an alternative packaged current sensor integrated circuit (IC) 200 may be similar to packaged current sensor IC 100 and thus may include a primary conductor 214 (that may be the same as or similar to primary conductor 114). A semiconductor die 230 (that may be the same as or similar to semiconductor die 130) is disposed adjacent to the primary conductor 214 and is positioned on an insulator portion 240 (that may be the same as or similar to insulator portion 140). A package body 250 encloses the semiconductor die 230 and a portion of the primary conductor 214. The package body 250 has an upper package body surface 250a and a lower package body surface 250b.

Current sensor IC 200 differs from current sensor IC 100 (FIGS. 1-5) in that pad 202 is partially embedded in the upper package body surface 250a, rather than attached to the upper package surface 150a as in FIG. 1. By partially embedded, it is meant that the pad 202 is disposed in the package body 250 in a recess 250c along the upper package body surface 250a. The recess 250c extends along a portion of the package body 250 along the upper package body surface 250a, securing the pad 202 in the package body 250. Accordingly, the pad 202, while secured in the package body 250, does not contact the semiconductor die 230, insulator portion 240, or primary conductor 214. During the manufacturing process of forming the package body 250, described above, the pad 202 may be molded into the package body 250. A pillar 204 (that may be the same as or similar to pillar 104) extends from the primary conductor 214 to the pad 202.

Figure 7:
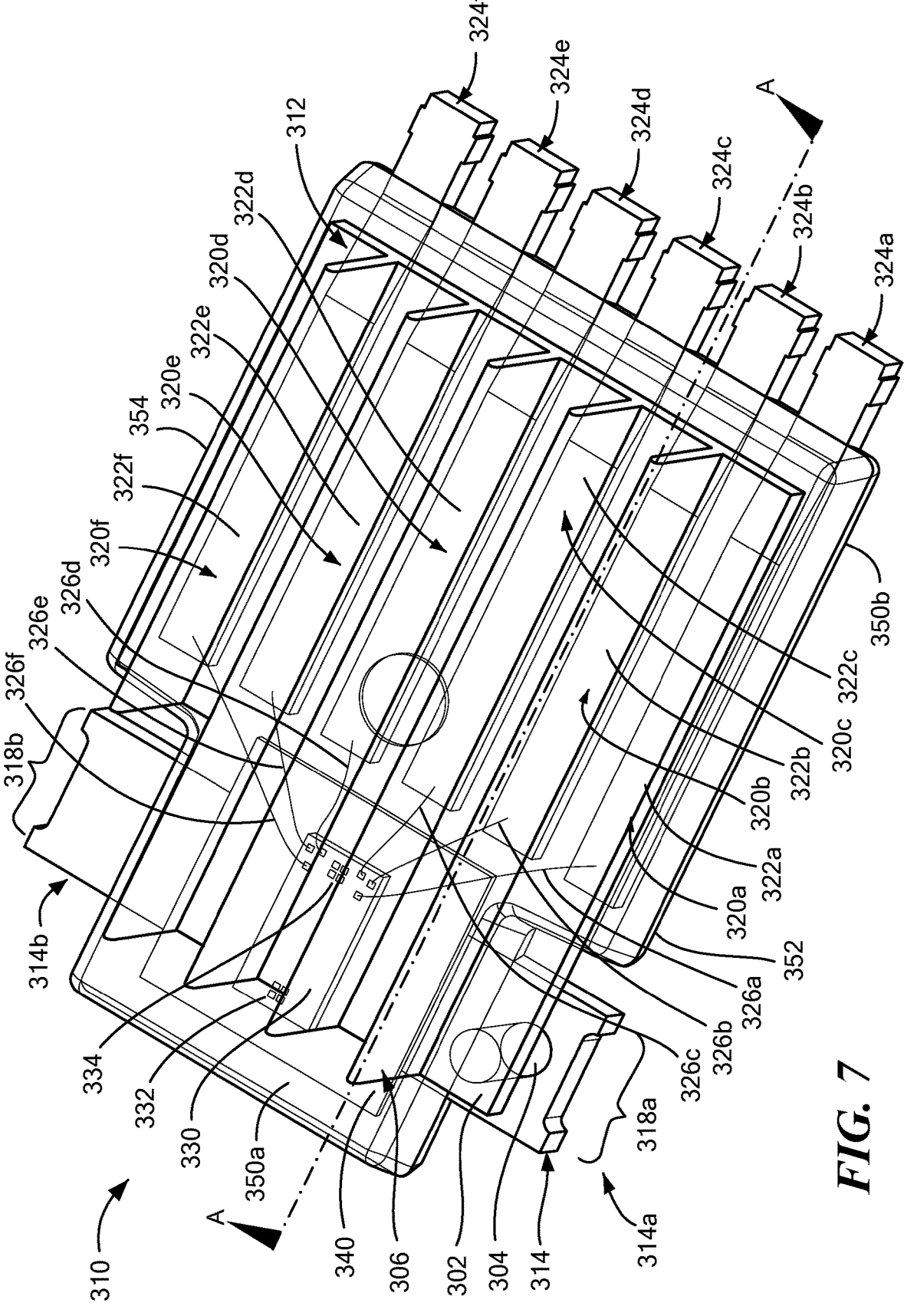
FIG. 7 is a perspective top view of another embodiment of a packaged current sensor integrated circuit with the package body in phantom, with a pad including one or more fins secured to the package body.

Referring to FIG. 7, an alternative packaged current sensor integrated circuit (IC) 300 may be similar to packaged current sensor IC 100 and thus may include a primary conductor 314 (that may be the same as or similar to primary conductor 114). A semiconductor die 330 (that may be the same as or similar to semiconductor die 130) is disposed adjacent to the primary conductor 314 and is positioned on an insulator portion 340 (that may be the same as or similar to insulator portion 140). A package body 350 encloses the semiconductor die 330 and a portion of the primary conductor 314. The package body 350 has an upper package body surface 350a and a lower package body surface 350b.

Current sensor IC 300 differs from current sensor IC 100 (FIGS. 1-5) in that pad 302 includes one or more fins 306 protruding from the pad 302. The pad 302 is secured to the upper package body surface 350a, the fins 306 extend away from the upper package body surface 350a. The fins 306 may provide additional cooling, by providing additional surface area for heat transfer. A pillar 304 (that may be the same as or similar to pillar 104) extends from the primary conductor 314 to the pad 302.

Figure 8:
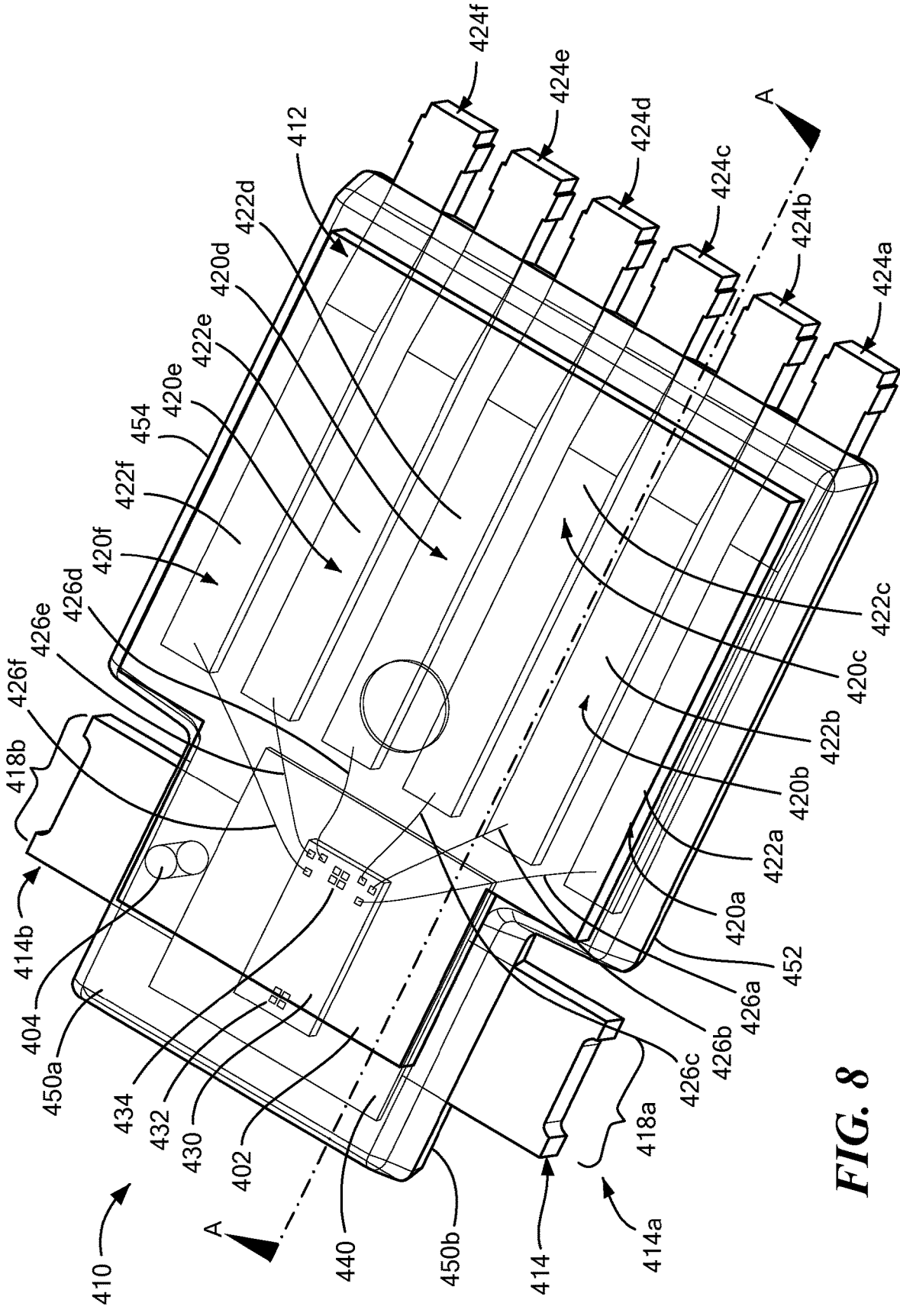
FIG. 8 is a perspective top view of another embodiment of a packaged current sensor with the package body in phantom, with a pillar disposed in the package body.

Referring to FIG. 8, an alternative packaged current sensor integrated circuit (IC) 400 may be similar to packaged current sensor IC 100 and thus may include a primary conductor 414 (that may be the same as or similar to primary conductor 114). A semiconductor die 430 (that may be the same as or similar to semiconductor die 130) is disposed adjacent to the primary conductor 414 and is positioned on an insulator portion 440 (that may be the same as or similar to insulator portion 140). A package body 450 encloses the semiconductor die 430 and a portion of the primary conductor 414. The package body 450 has an upper package body surface 450a and a lower package body surface 450b. A pad 402 is secured to the package body 450.

Current sensor IC 400 differs from current sensor IC 100 (FIGS. 1-5) in that a pillar 404 is disposed in the package body 450, as opposed to the pillar 104 disposed between the portion of the pad 102 that extends beyond the periphery of the package body 150 and the primary conductor 114 as in FIG. 1. The pillar 404 is disposed on the primary conductor 414 adjacent to the insulator portion 440 and extends to the pad 402. The pillar 404 is disposed near the output portion 414*b*, but may be disposed near the input portion 414*a*. The pillar 404 is not in contact with the insulator portion 440.

Figure 9:
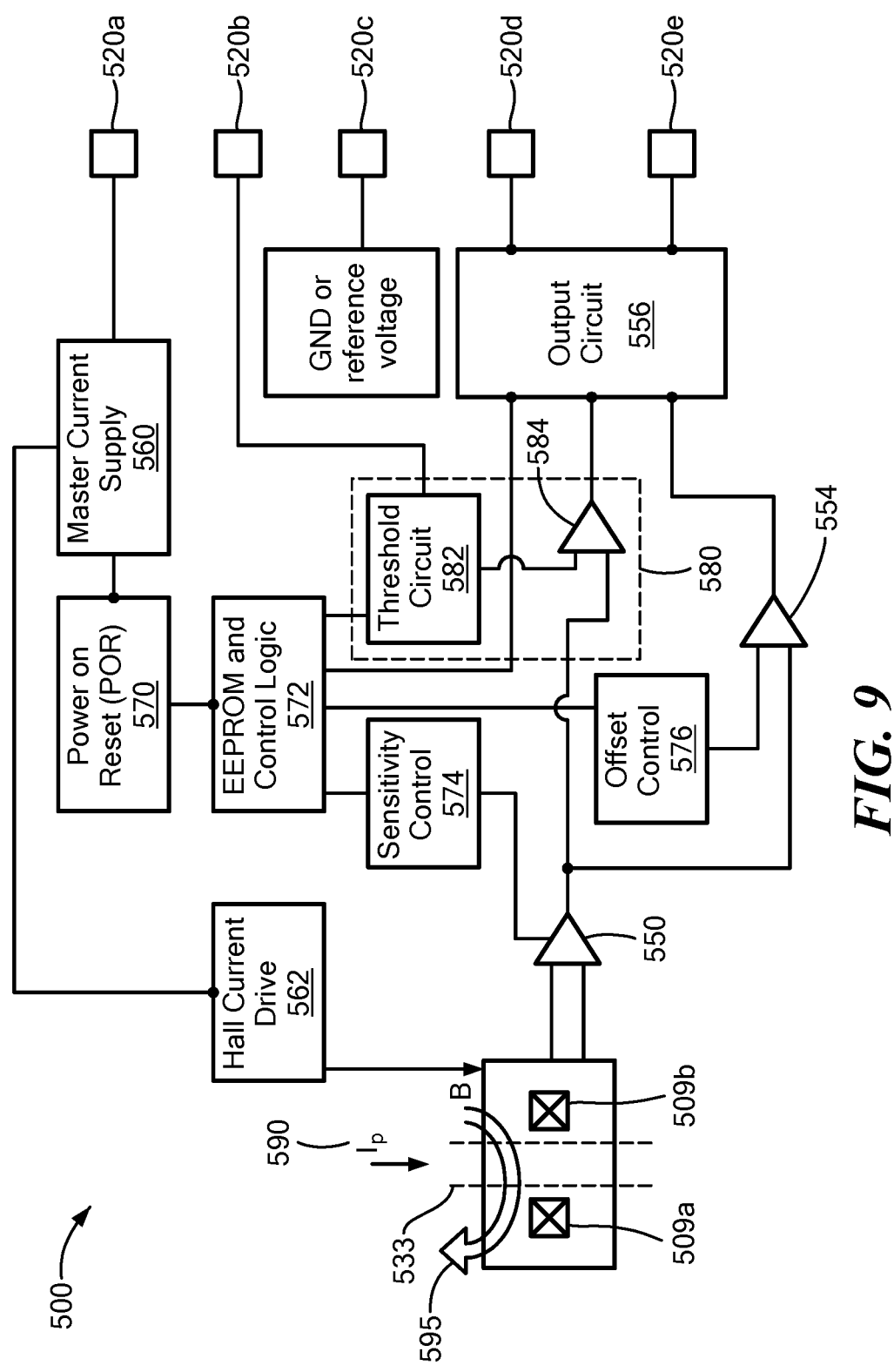
FIG. 9 is a schematic of an example current sensor.

Referring to FIG. 9, a schematic of an example circuit block diagram for an integrated circuit 500 which may be on the die 130 is shown. The primary current Ip 590 flows through a current conductor portion 533 (that may be the same as or similar to primary conductor 114) and generates a magnetic field B 595. The magnetic field B 595 can contain a component which comes up into the die at magnetic field sensing element 509*b* and down into the magnetic field sensing element 509*a*. The magnetic field sensing elements 509*a*, 509*b* may be planar Hall effect plates for example. The magnetic field 595 results in Hall effect plates 509*a*, 509*b* providing a signal to a front-end amplifier 550. A chopping or mixing circuit can be coupled between the Hall effect plates 509*a*, 509*b* and the amplifier 550. The front-end amplifier 550 provides an output to amplifier 554, which may be a linear amplifier, which feeds into an output circuit 556. Output circuit 556 may be a digital or analog circuit that provides an output to at least one bond pad 520*d*, 520*e*. Output bond pad 520*e* may be a linear output that represents the magnetic field 595 measured and amplified through the amplifier 554. Other numbers of output bond pads more than two may also be provided. In an alternate embodiment, the amplifier 554 may provide an output directly to bond pad 520*e*. Output bond pad 520*d* may be a fault output representative of a fault condition in the current sensor integrated circuit package.

Bond pad 520*a* provides a voltage and current input, typically Vcc, to provide power to the integrated circuit 500. A ground bond pad 520*c* may be provided to integrated circuit 500. In another embodiment, the voltage level provided at bond pad 520*c* may be other than ground, or a voltage above or below ground as a reference voltage to integrated circuit 500. Input bond pad 520*a* is coupled to a master current supply circuit 560 that provides power to the circuitry within integrated circuit 500. Although master current supply 560 is provided as a current supply, it would be apparent that voltages may also be provided to the circuits on integrated circuit 500. A Hall effect current drive circuit 562 takes current (or voltage) from the master current supply 560 and provides a regulated current to the Hall Effect sensing elements 509*a*, 509*b*. The master current supply 560 also provides power to a power on reset circuit 570. The power on reset circuit monitors the power coming into the circuit 500 and provides a signal to EEPROM and control logic circuit 572. The power on reset circuit 570 and EEPROM and control logic circuit 572 are used to configure and enable the integrated circuit, including the output circuit 556.

The EEPROM and control circuit 572 provides a signal to a sensitivity control circuit 574 which provides a signal to the front end amplifier 550 to adjust the sensitivity of the front end amplifier. The adjustment may be the result of a change in the power level in the circuit 500, or as a result of a temperature change of the circuit 500. An example of a temperature sensor circuit may include but is not limited to a diode temperature sensor, or the use of known temperature compensation resistors.

The EEPROM and control circuit 572 provides a signal to an offset control circuit 576. The offset control circuit 576 provides a signal to the amplifier 554. The offset control circuit 576 allows the circuit 500 to adjust the offset of the amplifier 554 for changes in power or temperature (the temperature compensation circuit is not shown) or a combination of temperature and power changes. The offset control circuit 576 may also provide adjustment for other offset sources, such as a stress in the integrated circuit die.

In another embodiment the EEPROM in the EEPROM and control circuit 572 may be replaced by another type of memory or used in combination with another type of non-volatile memory, including but not limited to a metal or polysilicon fuse, flash memory, or MRAM.

An input lead 520*b* may be provided to set a threshold for a fault indication circuit 580 (i.e., provide a fault trip level). In an embodiment, the input lead 520*b* provides a fault voltage level. The fault indication circuit 580 can include a threshold circuit 582 and a fault comparator 584. The EEPROM and control circuit 572 provides an input to the threshold circuit 582. The threshold circuit 582 provides a signal to the fault comparator 584, which compares the output of threshold circuit 582 with the output of the front end amplifier 550 to indicate when a fault exists to the output circuit block 556. The output circuit generates a fault output at output bond pad 520*d*. The fault output may indicate an overcurrent condition in which the current sensed in the current conductor path 533 exceeds a fault trip level, which trip level may be provided in the form of a fault voltage level on bond pad 520*b*. The fault allows, in one example, the user of the current sensor package 110 to turn off the current in the primary current path in order to prevent a high current condition in an electrical circuit connected to the primary conductor 114.

In an embodiment, functionality of the fault indication circuit 580 may be performed in a digital circuit or digital processor. The comparison to the fault trip level may include an analog to digital converter (ADC) prior to a digital logic circuit, which may include a processor or microprocessor circuit, which compares the fault trip level voltage to a voltage provided by the front end amplifier and an ADC circuit to convert the analog voltage of the front end amplifier 550 to a digital voltage. In an embodiment, the amplifier 550 may be a buffer amplifier with a gain near or equal to unity (or one). In another embodiment, the amplifier 554 may be introduce a non-unity gain.

In an embodiment, a multiplexer circuit may be used to allow for the output of front end amplifier circuit 550 and the fault trip level voltage to use the same ADC. It will be apparent to those of ordinary skill in the art that other circuits, such as timing circuits and sample and hold circuits, may be used to implement a multiplexed digital circuit.

An example current sensor IC may have an internal resistance of 100 µOhm and a maximum current of 200 A, thereby producing 4 W of heating power. Implementing a thermal pad (such as pad 102) on top of the package (for example packaged current sensor IC 100) provides an improved thermal performance as compared with a conventional package without a top side thermal pad. The exposed thermal pad thus advantageously implements cooling techniques via top side cooling.

The exposed pad is located on top of the IC package and will be in thermal contact with one terminal of the integrated conductor via a pillar. The pillar may or may not be encased in the overmolding (such as the package body 150) and would ideally be placed as close as possible to the highest resistance region of the integrated conductor. The pillar provides a low resistance path for the dissipated heat to flow to the exposed pad on top, rather than to the die (such as the semiconductor die 130). Since the contact is only on one side of the conductor (meaning the pillar is located on one side of the primary conductor), the contact will not disrupt the current measurement. Further, the exposed pad would provide a high frequency stray-field shield due to the eddy currents.

Although reference is made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A current sensor integrated circuit package, comprising:

a primary conductor having an input portion into which a current flows and an output portion from which the current flows;

a plurality of secondary leads;

a semiconductor die disposed adjacent to a top surface of the primary conductor and positioned on an insulator portion;

at least one magnetic field sensing element supported by the semiconductor die;

a package body comprising an upper package body surface adjacent to the top surface of the primary conductor, a first portion enclosing the semiconductor die and a first portion of the primary conductor, and a second portion enclosing an elongated portion of the plurality of secondary leads, wherein a second portion of the primary conductor is exposed;

a pad secured to the upper package body surface of the package body, wherein a portion of the pad extends beyond a periphery of the package body, the second, exposed portion of the primary conductor comprises the input portion of the primary conductor and the output portion of the primary conductor, and the portion of the pad extends over either the input portion of the primary conductor or the output portion of the primary conductor; and a pillar extending from the top surface of the primary conductor to the pad, wherein the pillar is disposed between the portion of the pad that extends beyond the periphery of the package body and the second, exposed portion of the primary conductor.

2. The current sensor integrated circuit package of claim 1, wherein the input portion has a reduced area edge and the output portion has a reduced area edge.

3. The current sensor integrated circuit package of claim 1, wherein the elongated portion of the plurality of secondary leads is offset with respect to an exposed portion of the respective secondary lead.

4. The current sensor integrated circuit package of claim 1, further comprising a non-conductive adhesive disposed between the pad and the package body.

5. The current sensor integrated circuit package of claim 1, wherein the pad is secured to the first portion of the package body, to the second portion of the package body, or to both the first portion of the package body and to the second portion of the package body.

6. The current sensor integrated circuit package of claim 1, wherein the pad is partially embedded in the package body.

7. The current sensor integrated circuit package of claim 6, wherein the pillar is disposed in the package body adjacent to the insulator portion.

8. The current sensor integrated circuit package of claim 1, wherein the pad comprises a nonferrous material.

9. The current sensor integrated circuit package of claim 1, wherein the pad comprises a ferrous material.

10. The current sensor integrated circuit package of claim 1, wherein the pillar comprises copper.

11. The current sensor integrated circuit package of claim 1, wherein the plurality of secondary leads comprises a first secondary lead providing an output connection of the current sensor integrated circuit package, a second secondary lead providing a voltage input connection of the current sensor integrated circuit package, and a third secondary lead providing a ground connection of the current sensor integrated circuit package.

12. The current sensor integrated circuit package of claim 1, further comprising a front-end amplifier supported by the semiconductor die, wherein the at least one magnetic field sensing element is coupled to the front-end amplifier.

13. The current sensor integrated circuit package of claim 1, comprising at least two magnetic field sensing elements.

14. The current sensor integrated circuit package of claim 13, wherein the at least two magnetic field sensing elements are Hall effect elements.

15. The current sensor integrated circuit package of claim 14, wherein the at least two magnetic field sensing elements are coupled to provide a differential output.

16. The current sensor integrated circuit package of claim 1, wherein at least one of the plurality of secondary leads provides a fault signal connection of the current sensor integrated circuit package.

17. A current sensor integrated circuit package, comprising:

a primary conductor having an input portion into which a current flows and an output portion from which the current flows;

a plurality of secondary leads;

a semiconductor die disposed adjacent to a top surface of the primary conductor and positioned on an insulator portion;

at least one magnetic field sensing element supported by the semiconductor die;

a package body comprising an upper package body surface adjacent to the top surface of the primary conductor, a first portion enclosing the semiconductor die and a first portion of the primary conductor, and a second portion enclosing an elongated portion of the plurality of secondary leads, wherein a second portion of the primary conductor is exposed;

a pad secured to the upper package body surface of the package body, wherein the pad comprises one or more fins protruding from the pad; and a pillar extending from the top surface of the primary conductor to the pad.

18. A current sensor integrated circuit package, comprising:

a primary conductor having an input portion into which a current flows and an output portion from which the current flows;

a plurality of secondary leads;

a semiconductor die disposed adjacent to a top surface of the primary conductor and positioned on an insulator portion;

at least one magnetic field sensing element supported by the semiconductor die;

a package body comprising an upper package body surface adjacent to the top surface of the primary conductor, a first portion enclosing the semiconductor die and a first portion of the primary conductor, and a second portion enclosing an elongated portion of the plurality of secondary leads, wherein a second portion of the primary conductor is exposed;

a pad secured to the upper package body surface of the package body; and a pillar extending from the top surface of the primary conductor to the pad, wherein the pillar is soldered or welded to the primary conductor.

19. The current sensor integrated circuit package of claim 2, wherein the reduced area edge of the input portion of the primary conductor does not extend beyond a first side edge of the package body and wherein the reduced area edge of the output portion of the primary conductor does not extend beyond a second side edge of the package body.

20. The current sensor integrated circuit package of claim 18, wherein a portion of the pad extends beyond a periphery of the package body.

21. The current sensor integrated circuit package of claim 20, wherein the second, exposed portion of the primary conductor comprises the input portion of the primary conductor and the output portion of the primary conductor and wherein the portion of the pad extends over either the input portion of the primary conductor or the output portion of the primary conductor.

* * * * *